United States Patent [19]
Gupta et al.

[11] Patent Number: 5,468,340
[45] Date of Patent: Nov. 21, 1995

[54] HIGHLY SELECTIVE HIGH ASPECT RATIO OXIDE ETCH METHOD AND PRODUCTS MADE BY THE PROCESS

[76] Inventors: Subhash Gupta, 1578 Meadow Ridge Cir., San Jose, Calif. 95131; Susan Chen, 1468 Mallard Way, Sunnyvale, Calif. 94087; Angela Hui, 2139 Devon Pl., Milpitas, Calif. 95035

[21] Appl. No.: 159,634

[22] Filed: Nov. 30, 1993

Related U.S. Application Data

[63] Continuation-in-part of Ser. No. 960,499, Oct. 9, 1992.

[51] Int. Cl.$^6$ .............................. H01L 21/00; H05H 1/00
[52] U.S. Cl. ................................. 216/67; 216/79
[58] Field of Search ...................... 156/643, 646, 156/644, 653, 657, 668; 204/192.37

[56] References Cited

U.S. PATENT DOCUMENTS

| | | | |
|---|---|---|---|
| 4,948,459 | 8/1990 | van Laarhoven et al. | 156/643 |
| 4,978,420 | 12/1990 | Bach | 156/643 |
| 5,021,121 | 6/1991 | Groechel et al. | 156/643 |
| 5,022,958 | 6/1991 | Favreau et al. | 156/63 |
| 5,176,790 | 1/1993 | Arleo et al. | 156/643 |
| 5,200,361 | 4/1993 | Onishi | 156/646 X |
| 5,213,659 | 5/1993 | Blalock et al. | 156/643 |
| 5,269,879 | 12/1993 | Rhoades et al. | 156/643 |
| 5,284,549 | 2/1994 | Barnes et al. | 156/662 |

*Primary Examiner*—Thi Dang

[57] ABSTRACT

A method for rapid anisotropic dry etching of oxide compounds in high aspect ratio openings which etching method is highly selective to metal salicides and which method employs plasma gases of $CHF_3$, $N_2$ and a high flow rate of He at a high pressure and products made by the process.

8 Claims, 2 Drawing Sheets

5,468,340

HIGHLY SELECTIVE HIGH ASPECT RATIO OXIDE ETCH METHOD AND PRODUCTS MADE BY THE PROCESS

RELATED INVENTION

This is a continuation-in-part of copending application Ser. No. 07/960,499, filed Oct. 9, 1992 of S. Gupta, et al, entitled, Plasma Etch Process, which parent case is commonly assigned to Advanced Micro Devices, Inc., the disclosure of which is incorporated herein by reference.

FIELD OF THE INVENTION

The present invention relates to a dry etching process for etching silicon compounds and in particular to a process which has applicability for making high aspect ratio holes and openings in $SiO_x$ compounds or glass and in particular to a process which is highly selective between the etch rate of $SiO_x$ and metal salicides ($MSi_x$), in particular $TiSi_x$.

BACKGROUND OF THE INVENTION

In the copending parent application, it is pointed out that there is a need for improved and rapid silicon compound etch processes for integrated circuit manufacture and for glass product manufacture. One of the most important measures of a good etch process is its ability to make clean, walled, high aspect ratio holes. Another important parameter for integrated circuit etch processes is high selectivity for the silicon oxide compounds as opposed to masking, or etch stop materials.

As explained in detail in the above mentioned parent case, in modern integrated circuit manufacture, because of the need for multiple metal interconnect layers, and due to the planarization requirements, the distance from the planarized top surface of an integrated circuit to the underlying low resistance interconnection contacting surfaces across a single chip can now vary widely, i.e., from 5000 Å to 20000 Å. The etch process for VIAS or openings to reach underlying metal must therefore be able to make the deeper holes while at the same time not damaging the materials at the bottom of the shallow holes. To accomplish this result, the etch process must be highly selective so that it does not substantially etch the material in the bottom of the VIA holes while at the same time continuing to rapidly etch the silicon compound of the deeper holes. In addition, the process must make clean side walls of such openings and VIA holes without forming or depositing significant amounts of debris i.e. polymers, on the wall or at the bottom of the openings or holes. In the parent case, a novel process was disclosed for making high aspect ratio VIA holes which is highly selective to TiN and which leaves essentially no polymer in the VIAS. The process disclosed in the parent application employs a high flow rate of a low mass atoms at high elevated pressure (10.0 Torr>p>0.8 Torr) to increase inelastic collision in order to effectively cool the plasma generated by the excitation of $CHF_3$ and nitrogen gasses using 400 KHz RF source.

There is a need to also provide improved etch processes having selectivity with respect to further materials commonly employed in integrated circuits in addition to TiN.

SUMMARY OF THE INVENTION

It is the object of this invention to provide a process for etching silicon compounds which process is highly selective to metal salicides ($MSi_x$) and in particular, highly selective to $TiSi_x$.

It is further object to provide a process for making high aspect ratio VIAS and openings through $SiO_x$ which will stop on $TiSi_x$ without significant etching thereof.

It is still further object to provide an integrated circuit product which has high aspect ratio clean VIAS through $SiO_x$ layers without making deposits of difficult or impossible to remove polymers in said VIAS, which VIAS end on a TiSi layer.

DETAILED DESCRIPTION OF THE INVENTION

Figure 2:
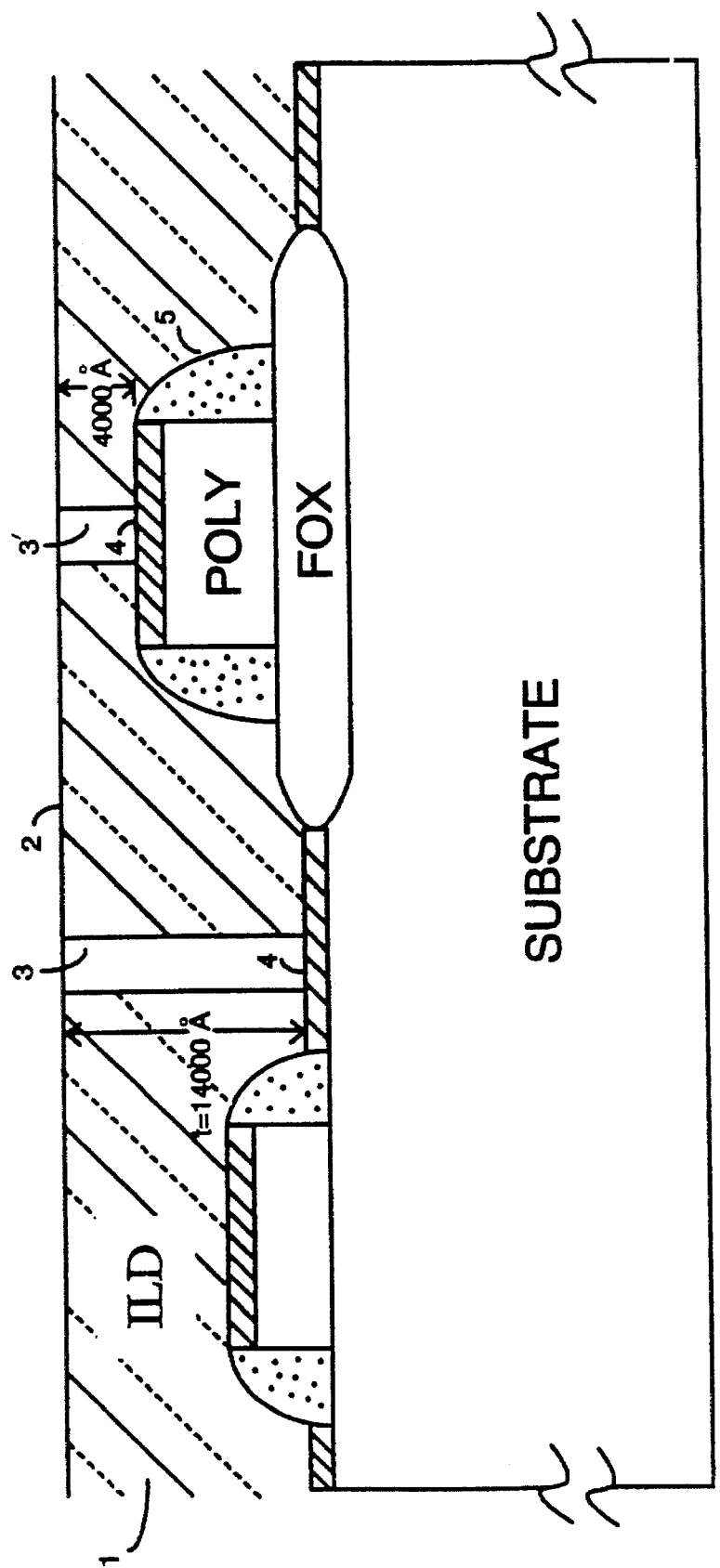
FIG. 2 is a cross section of a portion of a planarized integrated circuit.

Due to the requirements for planarization of the surface of integrated circuits, as seen in FIG. 2, the oxide 1 thickness remaining above the next lower level contact layer 4 after planarization of the upper surface 2 can now vary from 4000 Å to 20,000 Å. Since it is necessary to provide VIA holes 3 and 3' into the oxide surface down to this underlying contact layer, there will be substantial periods of time of so called "overetch" when the bottom of the shallower holes are being etched for a period before the bottom of the deeper holes are reached.

It is desired to provide devices where the contact layer 4 at the bottom of the hole is a thin layer 500 Å to 800 Å of metal salicide, i.e. preferably $TiSi_x$, and a process is needed which would not etch through the thin salicide layers at the bottom of the shallower etch holes during the processing of the deeper holes. We were particularly desirous of a process which would work with a 700 Å salicide layer which would complete the etch without removing the 700 Å $TiSi_x$ film.

This process requires a very high selectivity while at the same time demands a low polymer deposition and an anisotropic etch characteristic for providing a high aspect ratio. Prior etch processes employing both $CHF_3$ and $CF_4$ together could not provide the required selectivity and in the case of VIA manufacture were found to deposit polymer in the VIA holes which was not able to be completely removed with $O_2$ plasma ashing process steps. When polymer is not completely removed it results in high contact impedance of the fill plug.

Figure 1:
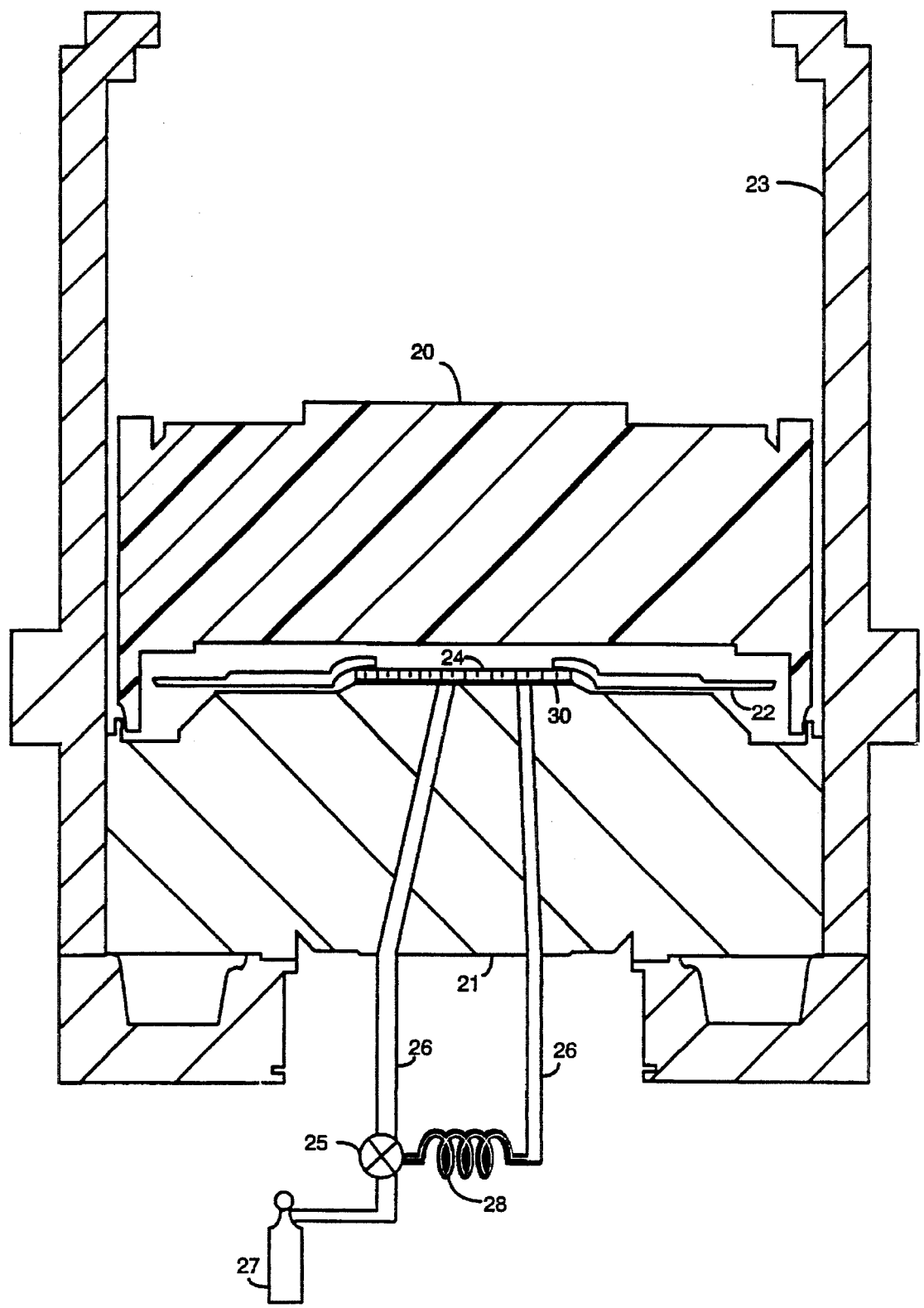
FIG. 1 is a schematic of the cross section of the interior of a vacuum chamber of a confined plasma reactor used with the inventive process.

Using an etching reactor apparatus as shown in FIG. 1 we have worked out a highly selective process which meets the above requirements. FIG. 1 is an illustration of the LAM Research, Inc., Model ET13 which was used in our work. The plasma reactor housing 23 supports a lower electrode 21 of Al on which the wafer 24 is clamped by clamps 22. The upper electrode 20 is usually graphite and the gap between the electrodes 20 and 21 is small and adjustable. In our experiments the gap was optimized. The wafer can optionally be cooled by backside He cooling via the ducts 26 conducting He under pressure through controller 25 into the space 30 under the wafer 24. Since the entire wafer in the reactor is held at vacuum pressures (vacuum pump is not shown) by providing a quantity of He behind the wafer at a somewhat higher pressure, the helium atoms introduced into the region 30 are employed, as is prior known, to provide conductive cooling of the backside surface of the wafer during plasma treatment of the top side of the wafer.

Even when backside cooling is employed and the temperature of the wafer is lowered, the kinetic energy of the ions in the plasma are essentially unaffected. Accordingly, the addition of a light mass gas to the plasma as described in the parent case is necessary to reduce the plasma temperature to improve the etch selectivity.

We have designed a fractional factorial study for $TiSi_x$ selectivity starting with the VIA process established in the earlier cited parent patent. The earlier process selectivity was optimized in connection with a TiN layer. The primary four factors considered were chamber pressure, $CHF_3$ flow rate, He flow rate and $N_2$ flow rate. The measured parameters were silicon compound (TEOS) etch rate, uniformity of etch, and $TiSi_x$ etch rate. The less sensitive factors were held constant. Specifically, the gap was set at 1.2 cm, and RF power at 800 watts and the He backside cooling pressure at 12 Torr.

The optimal process suggested by this first set of factorial experiments was:

PR=3000 MT
Power=800 W
gap=1.3 cm
$CHF_3$=40 SCCM
$N_2$=30 SCCM
He=3000 SCCM
Backside=12 Torr He At these conditions, the TEOS etch rate was 3400 Å/min with a uniformity of ±12.7% and selectivity of 22.2, i.e. oxide/$TiSi_x$ etch rate. The contact hole sidewall angle was only 82 degrees.

To improve the process further, a second fractional factorial was designed to cover a wider process range and incorporation of additional introduced other gasses such as $CF_4$ and Ar.

For this experiment six factors were explored: chamber pressure and flow rates of $CHF_3$, $CF_4$, Ar, He, and $N_2$. Since the plasma was unable to stabilize at some conditions, the pressure range was adjusted from 800 mT to 2400 mT. Both $CF_4$ and Ar flows were found not to help selectivity and to have little effect on etch rate or uniformity. Accordingly, both Ar & $CF_4$ were deleted from the factorial for an optimal process which was found to be:

PR=1500 MT
Power=800 W
gap=1.3 cm
$CHF_3$=60 SCCM
He=2300 SCCM
$N_2$=20 SCCM
Backside=12 Torr He The TEOS etch rate was 4000 Å/min with a uniformity of ±6% and selectivity for TEOS over $TiSi_x$ of 23:1. The angle of contact profile was 87 degrees.

A final factorial was designed to improve $TiSi_x$ selectivity. This time the gases, and the gas flows were held constant and the plasma process parameters such as power, gap and pressure were varied. The optimum process indicated by this factorial is:

PR=1700 MT
Power=900 W
gap=1.0 cm
$CHF_3$=60 SCCM
He=2300 SCCM
$N_2$=20 SCCM
Backside=12 Torr He The TEOS selectivity to $TiSi_x$ was 34:1 at a TEOS etch rate of 4200 Å/min with a contact profile of 87 degrees. The contact sidewalls looked generally clean. Using a simple standard O2 plasma ash, without any subsequent special treatment, a polymer free, clean sidewall was obtained as seen by SEM photographs.

With the above in view, it is not our intent to restrict our invention to the disclosed embodiment, rather it is our intention that the scope of our invention be controlled by the following claims.

What is claimed is:

1. In a method for plasma etching high aspect ratio holes or openings into a wafer substrate having a silicon compound ($SiO_x$) layer thereon, said wafer also having a metal silicide ($MSi_x$) layer underlying said $SiO_x$ layer and an overlying lithographically developed etch mask layer having covered and uncovered regions, where the steps include:

(a) installing said wafer in an etching reactor vacuum container having a pair of electrodes;

(b) compressing the surface of said substrate opposite from the surface having said $SiO_x$ layer to be etched to one of said electrodes;

(c) establishing a plasma in said vacuum container at a total pressures Pr greater than 1500 millitorr in a confined region between said two electrodes, said electrodes being displaced by gap distance less than 1.5 cm and providing (1) a flow of reaction gases consisting of $CHF_3$ and $N_2$ and He to said confined region and (2) RF power P at a frequency on the order of 400 KHz across said electrodes;

(d) cooling said plasma by inelastic collisions by causing a high flow rate of said He gas in relation to the flow rates of the remaining said reaction gases;

(e) adjusting the distance D, power P and a total pressure Pr and the flow rates of said $N_2$, $CHF_3$ and He to obtain a high selectivity etch rate of said silicon compound as compared to the etch rate of said metal silicide;

(f) discontinuing said etching of said wafer when all uncovered regions of said developed etch pattern mask have been etched down to said underlying metal silicide layer;

wherein flow rates of He/$CHF_3$/$N_2$ are substantially in the ratio 2300/60/20 whereby the etch rate of said $SiO_x$ is very much faster than the etch rate of said metal silicide.

2. The method of claim 1 wherein a further step comprises: removing any polymer deposited in the previously etched region by introducing $O_2$ and elevating the temperature high enough to substantially completely volatize said polymer through combustion with said $O_2$.

3. The method of claim 1 wherein said metal silicide is titanium silicide.

4. In a method for producing interlayer metal interconnects in an integrated circuit having salicide interconnect strips thereon, comprising (a) applying a dielectric fill over said metal salicide interconnect strips;

(b) planarizing the top of said dielectric fill;

(c) applying and lithographically patterning an etch mask over the top of said planarized layer to provide for contact openings via holes to connect conductive material to said metal salicide interconnect strips;

(d) placing said patterned wafer into a confined plasma etch reactor and fastening said wafer to an electrode of said machine;

(e) introducing reaction gases, said reaction gases consisting of $CHF_3$, $N_2$ and a light mass cooling gas including He into said confined plasma etch machine;

(f) exciting said plasma by applying RF energy at approximately 400 KHz wherein said He volume flow rate is much greater than the volume flow rate of either $CHF_3$ or $N_2$ and the total flow is adjusted to establish a pressure p, where 10.0 Torr>p>0.8 Torr, and wherein said He volume flow rate is approximately 96 percent of the total flow rate.

5. The method of claim 4 wherein said layer of metal salicide is on the order 700 Å.

6. The method of claim 5 including a further step (h), said step (h) comprises filing said VIA holes or openings with an electrically conductive material.

7. The method of claim 5 wherein said metal salicide is titanium silicide.

8. In a method for plasma etching high aspect ratio holes or openings into a substrate having a $SiO_x$ layer thereon, said wafer also having a metal salicide ($MSi_x$) layer underlying said $SiO_x$ layer and an overlying lithographically developed etch pattern mask layer having covered and uncovered regions, where the steps include (a) installing said wafer in an etching reactor vacuum container having a pair of electrodes;

(b) compressing the surface of said substrate opposite from the surface having said $SiO_x$ layer to be etched into one of said electrodes;

(c) establishing a plasma in said vacuum container at a total pressure Pr greater than 1500 millitorr in a confined region between said two electrodes, said electrodes being displaced by gap distance D less than 1.5 cm, and providing (1) a flow of reaction gases including $CHF_3$ and $N_2$ to said confined region and (2) RF power P at a frequency on the order of 400 KHz across said electrodes;

(d) cooling said plasma by inelastic collisions by causing a high flow rate of light mass He gas to be added to said reaction gases, said He flow rate being greater than 96% of the total volume flow rate;

(e) adjusting the distance D, power P and total pressure Pr and the flow rates of said $N_2$, $CHF_3$ and He to obtain a high selectivity etch rate of said silicon compound as compared to the etch rate of said metal salicide; and (f) discontinuing said etching of said wafer when all uncovered regions of said developed etch pattern mask have been etched down to said underlying metal salicide layer.

* * * * *